(12) United States Patent
Ueki et al.

(10) Patent No.: US 9,848,491 B2
(45) Date of Patent: Dec. 19, 2017

(54) WIRING BOARD, ELECTRONIC DEVICE, AND ELECTRONIC MODULE

(71) Applicant: KYOCERA Corporation, Kyoto-shi, Kyoto (JP)

(72) Inventors: Nobuhiro Ueki, Kyoto (JP); Hidehisa Umino, Kyoto (JP); Yousuke Moriyama, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/305,233

(22) PCT Filed: Apr. 22, 2015

(86) PCT No.: PCT/JP2015/062208
§ 371 (c)(1),
(2) Date: Oct. 19, 2016

(87) PCT Pub. No.: WO2015/163354
PCT Pub. Date: Oct. 29, 2015

(65) Prior Publication Data
US 2017/0071058 A1    Mar. 9, 2017

(30) Foreign Application Priority Data

Apr. 22, 2014    (JP) ................................ 2014-088284

(51) Int. Cl.
*H05K 1/02* (2006.01)
*H01L 23/12* (2006.01)
(Continued)

(52) U.S. Cl.
CPC ............ *H05K 1/0271* (2013.01); *H01L 23/12* (2013.01); *H01L 23/13* (2013.01); *H05K 1/11* (2013.01);
(Continued)

(58) Field of Classification Search
CPC ........ H05K 1/0271; H05K 1/11; H05K 1/181; H05K 5/0256; H05K 5/0026; H01L 23/13;
(Continued)

(56) References Cited

U.S. PATENT DOCUMENTS

2004/0178858 A1* 9/2004 Miyazaki ............. H03H 9/0547
331/158
2006/0279367 A1* 12/2006 Knecht .................... H03B 5/32
331/107 A
(Continued)

FOREIGN PATENT DOCUMENTS

| JP | 2002-158509 A | 5/2002 |
| JP | 2004-247627 A | 9/2004 |
| WO | 2013/180247 A1 | 12/2013 |

OTHER PUBLICATIONS

International Search Report, PCT/JP2015/062208, dated Jul. 14, 2015, 1 pg.

*Primary Examiner* — Hoa C Nguyen
*Assistant Examiner* — Christopher L Augustin
(74) *Attorney, Agent, or Firm* — Volpe and Koenig, P.C.

(57) ABSTRACT

A wiring board of the present invention comprises an insulating base comprising a main face a side face; a cutout section having a quadrilateral shape opened in the main face and the side face; an electrode disposed on an inner face of the cutout section; and a wiring conductor disposed on one of an inner part and a surface of the insulating base, and connected to the electrode. A side wall of the cutout section comprises a protruding portion that curves and protrudes outward relative to the side face at a center region in a direction along the side face.

10 Claims, 16 Drawing Sheets

(51) Int. Cl.
*H01L 23/13* (2006.01)
*H05K 1/11* (2006.01)
*H05K 1/18* (2006.01)
*H05K 5/00* (2006.01)
*H05K 5/02* (2006.01)

(52) U.S. Cl.
CPC ........... *H05K 1/181* (2013.01); *H05K 5/0026* (2013.01); *H05K 5/0256* (2013.01); *H01L 2224/16225* (2013.01); *H01L 2224/48091* (2013.01); *H01L 2224/48227* (2013.01); *H01L 2924/15174* (2013.01); *H01L 2924/181* (2013.01)

(58) Field of Classification Search
CPC ........... H01L 23/12; H01L 2224/48091; H01L 2224/48227
See application file for complete search history.

(56) References Cited

U.S. PATENT DOCUMENTS

| | | | | |
|---|---|---|---|---|
| 2009/0174291 | A1* | 7/2009 | Nagano | H03H 9/1021 310/344 |
| 2011/0114353 | A1* | 5/2011 | Iizuka | H01L 23/053 174/50.5 |
| 2014/0151105 | A1* | 6/2014 | Kuwahara | H05K 3/3442 174/260 |
| 2014/0177179 | A1* | 6/2014 | Iiyama | H05K 3/3442 361/748 |
| 2015/0107879 | A1* | 4/2015 | Hasegawa | H05K 1/0306 174/255 |
| 2015/0146397 | A1 | 5/2015 | Fujihara et al. | |

* cited by examiner

WIRING BOARD, ELECTRONIC DEVICE, AND ELECTRONIC MODULE

TECHNICAL FIELD

The present invention pertains to a wiring board, an electronic device, and an electronic module.

BACKGROUND ART

In a conventional wiring board, a wiring conductor is disposed on one of an inner part and a surface of an insulating base, and one of an cutout section is provided from a side face to a bottom face of the insulating base, and an electrode is provided connected to the wiring conductor on an inner face of the cutout section. In some cases, an electronic component or similar electronic device that includes this type of wiring board is bonded to a module board using solder or a similar bonding material. In such a case, this electrode is bonded to the module board via the solder or similar bonding material (see Japanese Unexamined Patent Application Publication No. 2002-158509).

SUMMARY OF INVENTION

Technical Problem

In recent years, problems have arisen due to increased heat generation due to increased functionality of electronic devices, and this increased heat generation has led to a large amount of heat being transmitted to the electrode of the wiring board. Consequently, a great amount of heat is applied to the electrode of the wiring board when operating the electronic device, which leads to the generation of stress at the electrode due to the difference in the coefficients between thermal expansion of the insulating base and the electrode.

Solution to Problem

A wiring board according to one aspect of the present invention comprises an insulating base comprising a main face and a side face; a cutout section having a quadrilateral shape opened in the main face and the side face; an electrode disposed on an inner face of the cutout section; and a wiring conductor disposed on one of an inner part and a surface of the insulating base, and connected to the electrode. A side wall of the cutout section comprises a protruding portion that curves and protrudes outward relative to the side face at a center region in a direction along the side face.

An electronic device according to one aspect of the present invention includes the wiring board, configured as described above; and an electronic component mounted on the wiring board.

An electronic module according to one aspect of the present invention is constituted by the electronic device, configured as described above, being connected to connection pads of a module board via a bonding material.

Advantageous Effects of Invention

According to the wiring board according to one aspect of the present invention, the wiring board comprises an insulating base comprising a main face and a side face; a cutout section having a quadrilateral shape opened in the main face and the side face; an electrode disposed on an inner face of the cutout section; and a wiring conductor disposed on one of an inner part and a surface of the insulating base, and connected to the electrode. Additionally, a side wall of the cutout section comprises a protruding portion that curves and protrudes outward relative to the side face at a center region in a direction along the side face. As such, even if stress is generated due to the difference in the coefficients of thermal expansion between the insulating base and the electrode when the electronic device is operated, this stress is dispersed in an inward direction of the cutout section, at the portion of the electrode corresponding to the protruding portion. As a result, separation of the electrode from the cutout section can be suppressed.

The electronic device according to one aspect of the present invention comprises the wiring board, configured as described above and, thereby, enables improvements to electrical reliability and electrical performance.

The electronic module according to one aspect of the present invention comprises the electronic device, configured as described above, being connected to connection pads of a module board via a bonding material. As a result, a wiring board with excellent long-term electrical connection reliability to the module board can be obtained.

DESCRIPTION OF EMBODIMENTS

Figure 7A:
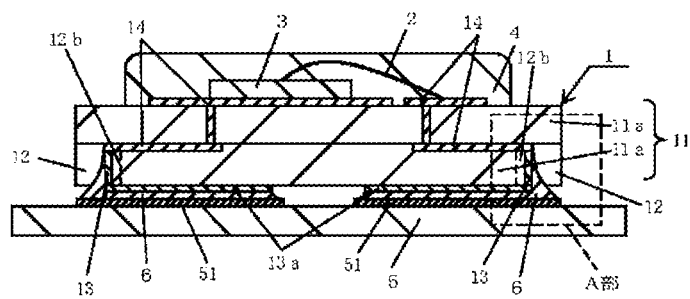
FIG. 7A is a cross-sectional view illustrating an electronic module in which the electronic device of FIG. 1 is mounted on a module board.
Figure 7B:
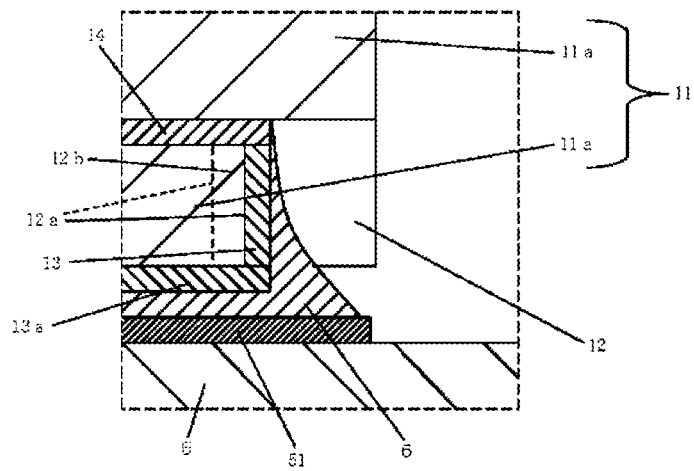
FIG. 7B is a main constituent enlarged cross-sectional view of section A of FIG. 7A.

Embodiments of the invention are described as examples, with reference to the accompanying drawings.
First Embodiment
An electronic device according to a first embodiment of the present invention comprises a wiring board 1 and an electronic component 2 disposed on a top face of the wiring board 1, as illustrated in FIGS. 1A, 1B, 2, 7A, and 7B. As illustrated in FIGS. 7A and 7B, the electronic device is connected, for example, on a module board 5 constituting an electronic module, using a bonding material 6.

As illustrated in FIGS. 1A, 1B, 2, 3A, and 3B, the wiring board 1 comprises an insulating base 11 including a main face and a side face, a cutout section 12 that is opened in the main face and the side face and has a quadrilateral shape when viewed from the bottom face, an electrode 13 disposed on an inner face of the cutout section 12, and a wiring conductor 14 that is disposed on one of an inner part and a surface of the insulating base 11 and is connected to the electrode 13. A side wall 12a of the cutout section 12 comprises a protruding portion 12b that curves and protrudes outward relative to the side face at a center region in a direction along the side face. In FIGS. 1A, 1B, 2, 7A, and 7B, the electronic device is mounted on an X-Y plane in a virtual X-Y-Z space. In FIGS. 1A, 1B, 2, 7A, and 7B, the upward direction is a positive direction along a virtual Z axis. Note that the terms "up/top" and "down/bottom" are used in the following description by way of convenience and should not be construed as limitations in the actual use of the wiring board 1 and the like.

The insulating base 11 is formed from a plurality of insulating layers 11a, has a top face that includes a mounting region for an electronic component 2, and is shaped as a rectangular plate when viewed planarly, that is, from a direction perpendicular to the main face. The insulating base 11 functions as a support body for supporting the electronic component 2. The electronic component 2 is fixedly fastened on the mounting region at a central portion of the top face of the insulating base 11 via a bonding member such as low-melting point brazing material, a conductive resin, or the like.

The insulating base 11 may, for example, be made from ceramics, such as an aluminum oxide-based sintered body (i.e., alumina ceramic), an aluminum nitride-based sintered body, a mullite-based sintered body, or a glass ceramic sintered body.

In a situation where the insulating base 11 is made from an aluminum oxide-based sintered body, for example, the insulating base 11 is manufactured as follows. A suitable organic binder, solvent and the like are added to and combined with raw material powders of aluminum oxide, silicon oxide, magnesium oxide, calcium oxide, and the like to produce a slurry. The slurry is formed into a sheet using one of a doctor blade method, a calendar roll method, or the like to obtain a ceramic green sheet. After an appropriate time, a suitable punching process is applied to the ceramic green sheet, which is then stacked in plurality and fired at a high temperature (e.g., 1600° C.).

The cutout section 12 is opened in the main face and the side face of the insulating base 11. In FIGS. 1A, 1B, 2, 3A, 3B, 7A, and 7B, the cutout section 12 that is opened in the bottom main face (bottom face) and the side face of the insulating base 11 has a rectangular shape when viewed planarly. The cutout section 12 is formed so that a width W of the cutout section 12 (a length along the side face of the insulating base 11) is greater than a length L1 of the cutout section 12 (a length from the side face of the insulating base 11 to the bottom of the side wall 12a of the cutout section 12) (L1<W). In the examples illustrated in FIGS. 1A, 1B, 2, 3A, and 3B, when viewed planarly, the cutout section 12 is formed in a rectangular shape (a quadrilateral shape) with arc shaped corners, and is formed so as to be long along the outer edge of the insulating base 11. Note that when viewed planarly, the cutout section 12 may be opened via a cutout of a width greater than the width of the cutout section 12, that is, cutouts of a plurality of sizes may be stacked. The cutout section 12, configured as described above, is provided in several ceramic green sheets intended for use in the insulating base 11 using one of laser processing, a punching process using a die, or the like, which forms a through-hole that serves as the cutout section 12.

The electrode 13 is disposed on an inner face of the cutout section 12, and the wiring conductor 14 is disposed on the surface and on the inner part of the insulating base 11. In the examples illustrated in FIGS. 1A, 1B, 2, 3A, 3B, 4A, and 4B, a main face electrode 13a that is connected to the electrode 13 is disposed on the main face where the cutout section 12 is open. Note that the electrode 13 and the main face electrode 13a are configured so as to collectively form an external electrode. The electrode 13 and the wiring conductor 14 are connected at a bottom portion of the cutout section 12. As illustrated in the example depicted in FIG. 4A, in a cross-sectional view, the electrode 13 may be extended about 0.05 to 0.1 mm into the inner portion of the insulating base 11 at the connecting portion with the wiring conductor 14. Note that the electrode 13 may be extended so as to surround the cutout section 12 when viewed planarly, instead of only being extended at the connecting portion with the wiring conductor 14. Additionally, as illustrated in the example depicted in FIG. 4B, in a cross-sectional view, the wiring conductor 14 may be extended about 0.01 to 0.5 mm onto the inner face of the cutout section 12 at the connecting portion with the electrode 13. Additionally, the electrode 13 and the wiring conductor 14 may both be extended. Thus, when one of the electrode 13 and the wiring conductor 14 is extended, an excellent electrical connection between the electrode 13 and the wiring conductor 14 can be obtained. The external electrode that includes the electrode 13 and the main face electrode 13a is for bonding to the module board 5. The electrode 13, the main face electrode 13a, and the wiring conductor 14 serve to electrically connect the electronic component 2 mounted on the wiring board 1 to the module board 5. The wiring conductor 14 includes a wiring conductor 14 disposed on one of the surface and the inner portion of the insulating base 11, and a through conductor that electrically connects wiring conductors, each positioned above and below, to each other through the insulating layers 11a that constitute the insulating base 11.

The electrode 13, the main face electrode 13a, and the wiring conductor 14 may be made from a metal material such as tungsten (W), molybdenum (Mo), manganese (Mn), silver (Ag), or copper (Cu). For example, in a situation where the insulating base 11 is formed from an aluminum oxide-based sintered body, the following may be performed. A conductor paste, obtained by combining a high-melting point metal powder of tungsten, molybdenum, manganese, and the like with an organic binder, a solvent, and the like, is applied in advance by printing in a predetermined pattern using a screen printing method on the ceramic green sheet intended as the insulating base 11. The paste is fired simultaneously with the ceramic green sheet intended as the insulating base 11, thus forming the above-listed components deposited at predetermined positions on the insulating base 11. In a situation where the wiring conductor 14 is a through conductor, a through-hole is formed in the green sheet by one of a laser process and a punching process using one of a die and punching. A printing method is then used to fill the through-hole with conductive paste for the wiring conductor 14, thus forming the wiring conductor 14. The electrode 13 is formed by print application of a conductive paste for the electrode 13 to a region intended as the inside face of the through-hole intended as the cutout section 12. The main face electrode 13a is formed by print application of a conductive paste intended as the main face electrode 13a to the ceramic green sheet intended as the insulating base 11.

The side wall 12a of the cutout section 12 includes the protruding portion 12b that curves and protrudes outward (the X direction in FIGS. 1A, 1B, 2, 3A, and 3B) relative to the side face of the insulating base 11 at the center region in the direction along the side face of the insulating base 11. Here, the term "center region" refers to, for example, a region of the cutout section 12 included in a dimension $\frac{2}{3}$ the width W of the cutout section 12, at the center in the direction along the side face of the insulating base 11 (the Y direction in FIGS. 1A, 1B, 2, 3A, and 3B). Additionally, when viewed planarly, a length L2 of the protruding portion 12b (length from the bottom of the side wall 12a of the cutout section 12 to an apex of the protruding portion 12b) is formed so as to protrude to the side face side of the insulating base 11 at a length of about 5% to 30% of the length L1 (length from the side face of the insulating base 11 to the bottom of the side wall 12a of the cutout section 12) of the cutout section 12 ($0.05L1 \leq L2 \leq 0.3L1$). This protruding portion 12b can be formed by adjusting, for example, the components, amounts, and glass transition temperatures Tg of the organic binders included in the ceramic green sheets, and by adjusting the temperature and the like when laminating the ceramic green sheets; thereby adjusting the deformation of the portion intended as the side wall 12a of the cutout section 12 when applying pressure to the ceramic green sheets in a thickness direction. Additionally, the protruding portion 12b can be formed by providing a through-hole intended as the cutout section 12 including the side wall 12a in advance in the ceramic green sheet by one of a laser process and a punching process, the through-hole having a shape including the protruding portion 12b at the center region in the direction along the side face of the insulating base 11. Note that, the bottom of the side wall 12a is the portion of the side wall 12a where the distance from the side face of the insulating base 11 is the greatest; and the apex of the protruding portion 12b is the portion of the protruding portion 12b that extends the most to the side face side of the insulating base 11.

As illustrated in the examples depicted in FIGS. 1A, 1B, 3A, and 3B, it is preferable that bulging outward relative to the side face gradually increases as it gets further from the bottom of the side wall 12a of the cutout section 12, that is, from each laterally neighboring region of the side wall 12a, toward the apex of the protruding portion 12b in the center region. This is because, in cases where the wiring board 1 is connected to the module board 5 via the bonding material 6, the surface of the curved face of the bonding material 6 formed by bonding from the bottom of the side wall 12a to the apex of the protruding portion 12b will easily become smooth and, in cases where stress from outside sources is applied, stress applied to one of the external electrode and the bonding material 6 can be effectively dispersed. Additionally, it is preferable that an entirety of the center region in the direction along the side face of the insulating base 11, of the side wall 12a of the cutout section 12, is a protruding curved face. This is because, in cases where the wiring board 1 is connected to the module board 5 via the bonding material 6, in cases where stress from outside sources is applied, stress applied to one of the external electrode and the bonding material 6 can be dispersed throughout the entire center region of the side wall 12a. Here, in cases where the entirety of the center region of the side wall 12a is a protruding curved face, when viewed planarly, the side wall 12a has a curved shape from the bottom of the side wall 12a to the apex of the protruding portion 12b.

Figure 1A:
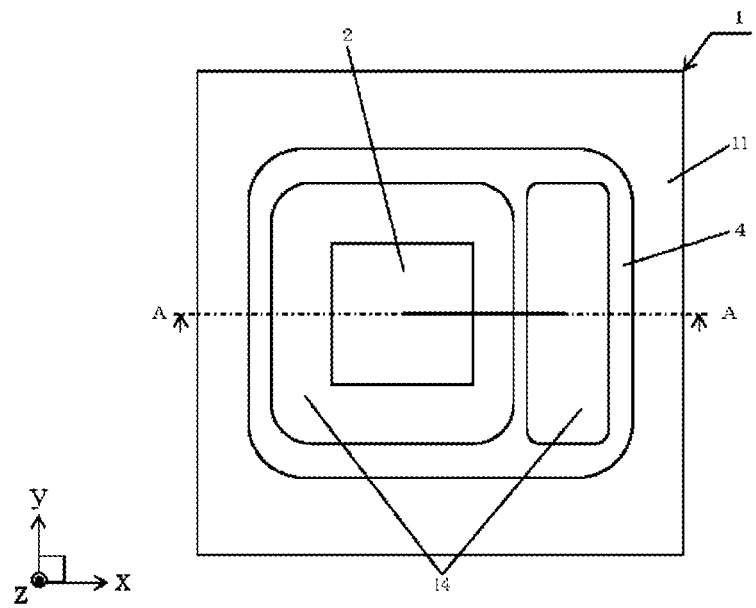
FIG. 1A is a top face view illustrating an electronic device according to a first embodiment of the present invention.
Figure 1B:
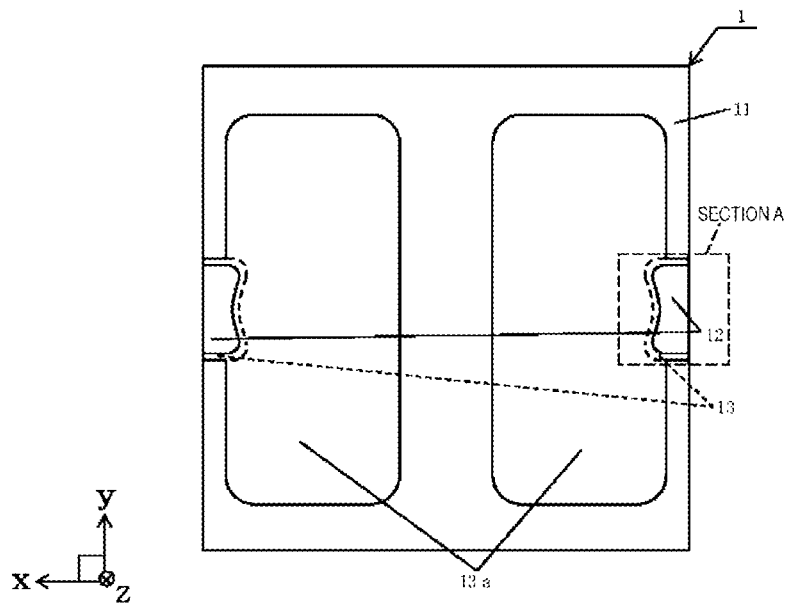
FIG. 1B is a bottom face view of FIG. 1A.
Figure 2:
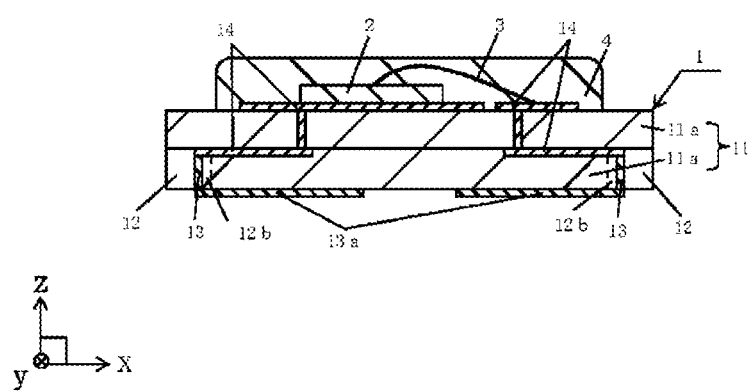
FIG. 2 is a cross-sectional view taken along line A-A of the electronic device depicted in FIG. 1A.
Figure 3A:
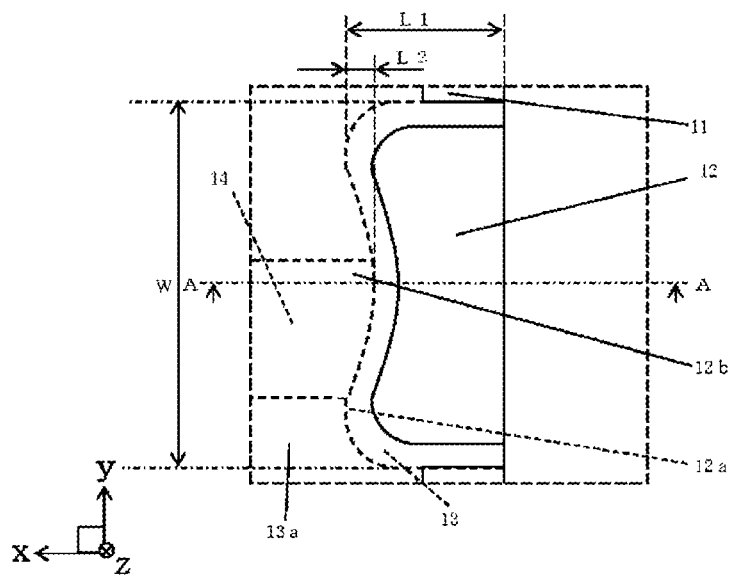
FIG. 3A is a main constituent enlarged bottom face view of section A of the electronic device depicted in FIG. 1B.
Figure 3B:
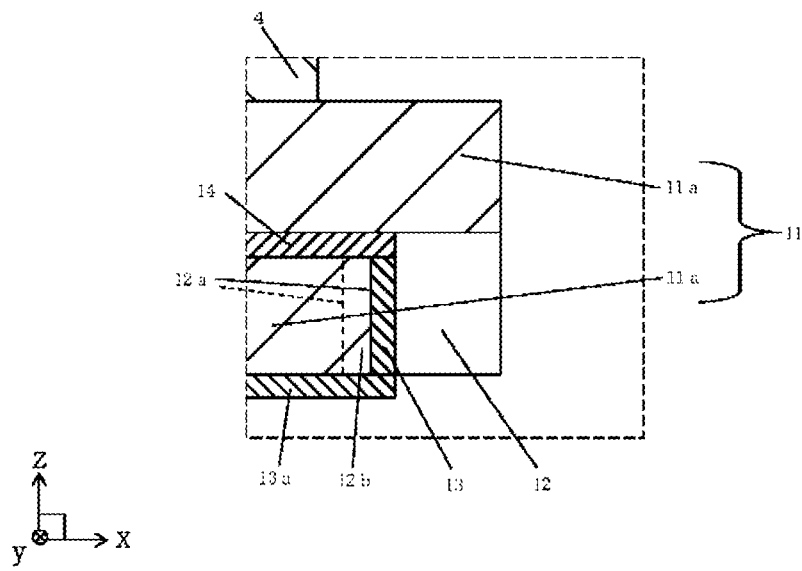
FIG. 3B is a main constituent enlarged cross-sectional view taken along line A-A in FIG. 3A.

Additionally, as illustrated in the example depicted in FIGS. 3A and 3B, when the shape of the cutout section 12 viewed from the bottom face is line-symmetric, with the apex of the protruding portion 12b as the center, in cases where the wiring board 1 is connected to the module board 5 via the bonding material 6, in cases where stress from outside sources is applied, stress applied to one of the external electrode and the bonding material 6 can be dispersed in a uniform manner.

The wiring board 1 according to the first embodiment of the present invention can, for example, be manufactured by the following manufacturing method.

Figure 5A:
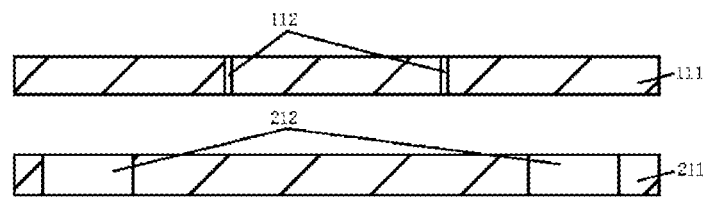
FIGS. 5A to 5D are cross-sectional views illustrating a first manufacturing method of an electrode and a wiring conductor of a wiring board according to the first embodiment of the present invention.
Figure 5B:
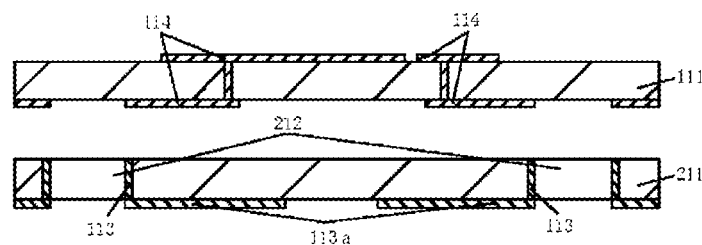
Figure 5C:
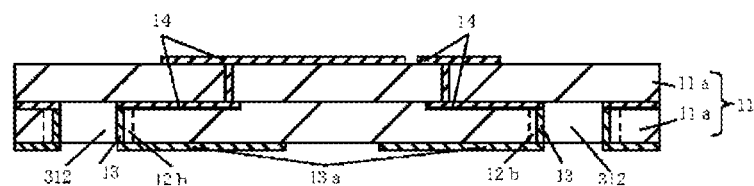
Figure 5D:
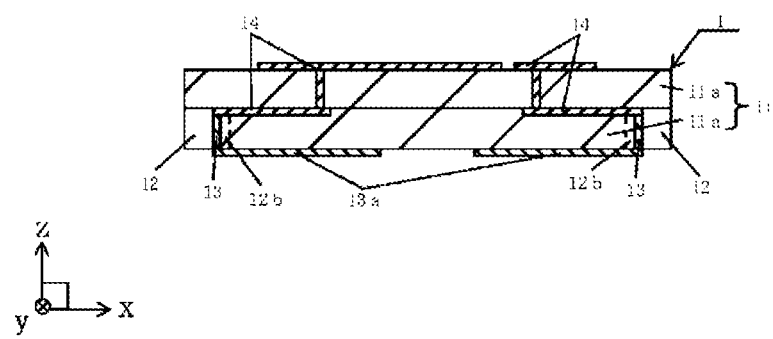

As illustrated in FIG. 5A, in a first manufacturing method, through-holes 112 for the wiring conductor 14 and through-holes 212 for the cutout section 12 are formed in ceramic green sheets 111 and 211 intended as the insulating base 11. Then, as illustrated in FIG. 5B, a conductive paste 113 for the electrode 13 is print applied by a screen printing method to an inner face of the through-holes 212 intended as the cutout section 12 in the ceramic green sheet 211. Additionally, a conductive paste 113a for the main face electrode 13a is print applied by a screen printing method to a surface of the ceramic green sheet 211. Here, the conductive paste 113 for the electrode 13 and the conductive paste 113a for the main face electrode 13a are formed so as to be connected. Additionally, a conductive paste 114 for the wiring conductor 14 is print applied by a screen printing method to surfaces of the ceramic green sheet 111 and to the through-holes 112 for the wiring conductor 14. Then, the ceramic green sheet 111 and the ceramic green sheet 211 are laminated and pressed and, as a result, the conductive paste 113 for the electrode 13 and the conductive paste 114 for the wiring conductor 14 become connected, and a center region (a portion intended as the center region of the side wall 12a of the cutout section 12) of the opposing inner walls of the through-holes 212 for the cutout section 12 is formed so as to curve and protrude outward. Thus, a ceramic raw laminate intended as the insulating base 11 is formed. Then, this ceramic raw laminate is fired and, as a result, as illustrated in FIG. 5C, an insulating base 11 is formed that includes a recess portion 312, intended as the cutout section 12, that includes the electrode 13 on the inner face and the protruding portion 12b on the opposing inner walls. Furthermore, as illustrated in the example depicted in FIG. 5D, by cutting the recess portion 312, a wiring board 1 can be fabricated that includes the electrode 13 disposed on the inner face of the cutout section 12, and the protruding portion 12b that curves and protrudes outward relative to the side face of the insulating base 11 at the center region in the direction along the side face of the insulating base 11 of the side wall 12a of the cutout section 12.

Figure 6A:
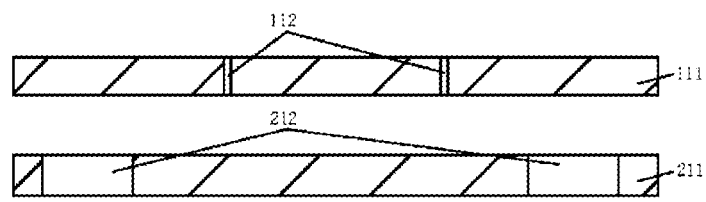
FIGS. 6A to 6D are cross-sectional views illustrating a second manufacturing method of the electrode and the wiring conductor of the wiring board according to the first embodiment of the present invention.
Figure 6B:
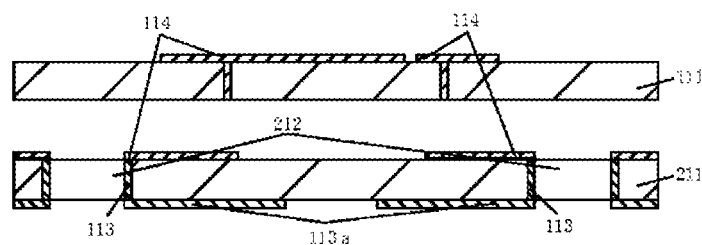
Figure 6C:
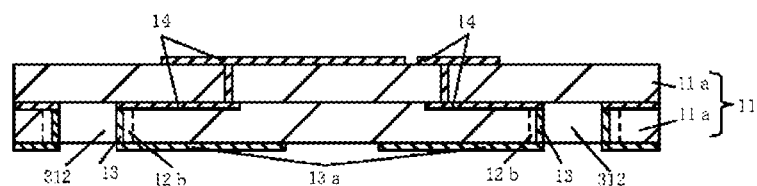
Figure 6D:
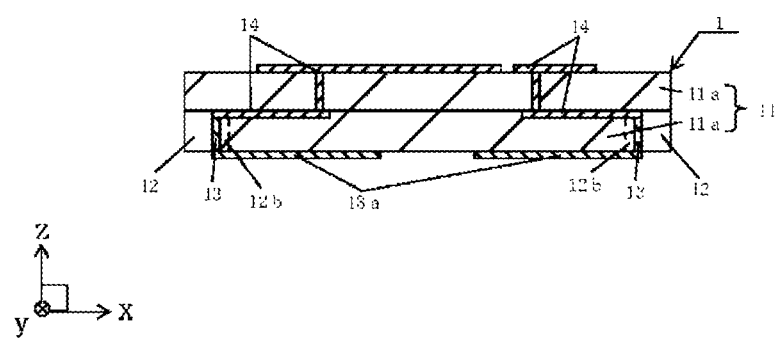

Next, a second manufacturing method is described. In the second manufacturing method, as with the first manufacturing method, as illustrated in FIG. 6A, through-holes 112 for the wiring conductor 14 and through-holes 212 for the cutout section 12 are formed in ceramic green sheets 111 and 211, which are intended as the insulating base 11. Then, as illustrated in FIG. 6B, a conductive paste 113 for the electrode 13 is print applied by a screen printing method to an inner face of the through-holes 212 intended as the cutout section 12 in the ceramic green sheet 211, and a conductive paste 113a for the main face electrode 13a and a conductive paste 114 for the wiring conductor 14 are print applied by a screen printing method to surfaces of the ceramic green sheet 211. Here, the conductive paste 113 for the electrode 13 and the conductive paste 114 for the wiring conductor 14, and the conductive paste 113 for the electrode 13 and the conductive paste 113a for the main face electrode 13 are formed so as to be respectively connected. An excellent connection between the conductive paste 113 for the electrode 13 and the conductive paste 114 for the wiring conductor 14 can be obtained by extending the conductive paste 113 for the electrode 13 to the surface of the ceramic green sheet 211, extending the conductive paste 114 for the wiring conductor 14 to the inner face of the through-holes 212 for the cutout section 12, or extending both the conductive paste 113 for the electrode 13 and the conductive paste 114 for the wiring conductor 14. Additionally, the conductive paste 114 for the wiring conductor 14 is print applied by a screen printing method to surfaces of the ceramic green sheet 111 and to the through-holes 112 for the wiring conductor 14. Then, the ceramic green sheet 111 and the ceramic green sheet 211 are laminated and pressed and, as a result, the conductive pastes 114 for the wiring conductor 14 that are formed on the ceramic green sheets 112 and 211 become connected, and center regions (portions intended as the center region of the side wall 12a of the cutout section 12) of the opposing inner walls of the through-holes 212 for the cutout section 12 are formed so as to curve, protruding outward. Thus, a ceramic raw laminate intended as the insulating base 11 is formed. Then, this ceramic raw laminate is fired and, as a result, as illustrated in FIG. 6C, an insulating base 11 is formed that includes a recess portion 312, intended as the cutout section 12, that includes the electrode 13 on the inner face and the protruding portion 12b on the opposing inner walls. Furthermore, as illustrated in the example depicted in FIG. 6D, by cutting the recess portion 312, a wiring board 1 can be fabricated that includes the electrode 13 disposed on the inner face of the cutout section 12, and the protruding portion 12b that curves and protrudes outward relative to the side face of the insulating base 11 at the center region in the direction along the side faces of the insulating base 11 of the side wall 12a of the cutout section 12.

In the first manufacturing method and the second manufacturing method, in cases where the through-holes 212 intended as the cutout section 12 are formed in a rectangular shape (a quadrilateral shape) with arc shaped corners when viewed planarly, the length between opposing inner walls (sides having the portion intended as the center region of the side wall 12a of the cutout section 12) of the through-holes 212 for the cutout section 12 is set to be less than or equal to the length (equivalent to the width W of the cutout section 12) between the other opposing inner walls of the through-hole 212 for the cutout section 12. As such, when laminating the ceramic green sheet 111 and the ceramic green sheet 211, it is easier to form the opposing inner walls (the portion intended as the center region of the side wall 12a of the cutout section 12) of the through-holes 212 for the cutout section 12 so as to protrude. Specifically, it is preferable that the width W of the cutout section 12 be formed 2-times or greater than the length of the depth (length from the side face of the insulating base 11 to the center region of the side wall 12a of the cutout section 12) of the cutout section 12. Note that, in the first manufacturing method and the second manufacturing method, it is preferable that the length of the opposing inner walls (sides having the portion intended as the center region of the side wall 12a of the cutout section 12) of the through-holes 212 for the cutout section 12 is set to 0.75-times or less than the length (equivalent to the width W of the cutout section 12) between the other opposing inner walls of the through-holes 212 for the cutout section 12.

In contrast with the first manufacturing method, with the second manufacturing method, an excellent connection between the conductive paste 113 for the electrode 13 and the conductive paste 114 for the wiring conductor 14 can be obtained; and, furthermore, this excellent connection between the conductive paste 113 for the electrode 13 and the conductive paste 114 for the wiring conductor 14 can be obtained even when the ceramic green sheet 111 and the ceramic green sheet 211 are subjected to laminating and pressing in order to form the opposing inner walls (portions intended as the center region of the side wall 12a of the cutout section 12) of the through-holes 212 for the cutout section 12 so as to curve and protrude toward the outer side. Thus, a wiring board 1 with excellent electrical connection between the electrode 13 and the wiring conductor 14 can be easily formed, and can be advantageously used in small, high-output electronic devices.

Figure 4A:
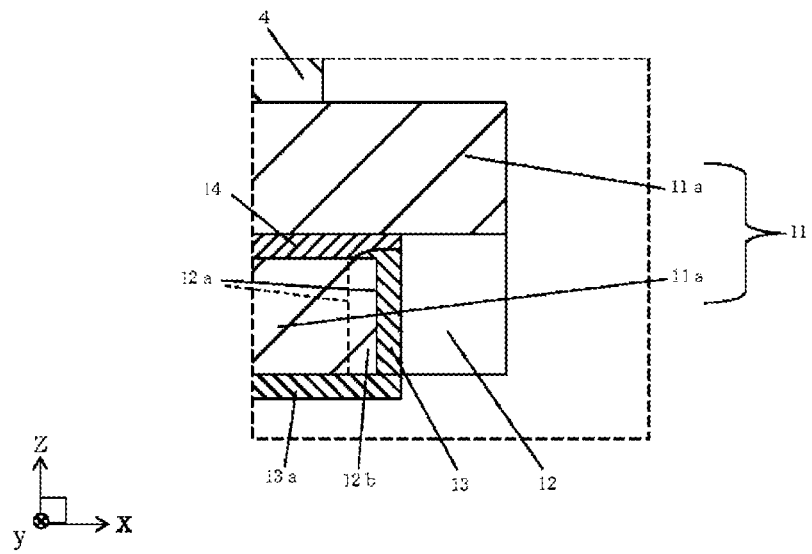
FIGS. 4A and 4B are main constituent enlarged cross-sectional views of another example of the electronic device according to a first embodiment of the present invention.
Figure 4B:
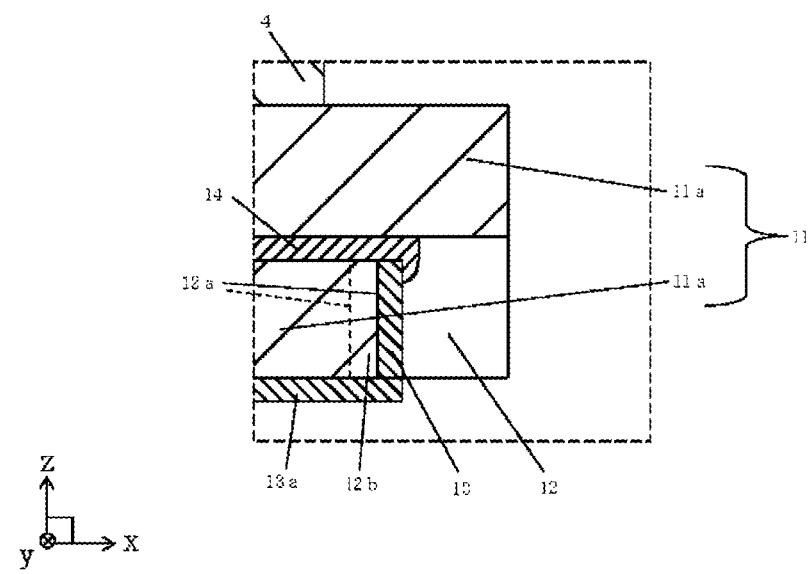

Additionally, in the second manufacturing method, as illustrated in FIGS. 4A and 4B, one of the conductive paste 113 for the electrode 13 and the conductive paste 114 for the wiring conductor 14 is formed so as to extend and overlap with the other conductive paste. As a result, a wiring board 1 with excellent electrical connection between the electrode 13 and the wiring conductor 14 can be formed.

Additionally, in the first manufacturing method, a connection conductor may be provided to obtain an excellent connection between the electrode 13 and the wiring conductor 14. Such a connection conductor can be fabricated using the same materials and methods as used for one of the electrode 13 and the wiring conductor 14.

A plating layer is deposited using one of an electroplating method and an electroless plating method on exposed surfaces of the electrode 13, the main face electrode 13a, and the wiring conductor 14. The plating layer is formed from a metal that has excellent corrosion resistance and connectivity with connecting members, such as nickel, copper, gold, silver, and the like. For example, a nickel plating layer with a thickness of about 0.5 to 5 µm and a gold plating layer with a thickness of about 0.1 to 3 µm are sequentially deposited or, alternatively, a nickel plating layer with a thickness of about 1 to 10 µm and a silver plating layer with a thickness of about 0.1 to 1 µm are sequentially deposited. As a result, corrosion of the electrode 13, the main face electrode 13a, and the wiring conductor 14 can be effectively suppressed. Additionally, this enables strengthening of the fixing between the wiring conductor 14 and the electronic component 2, the bonding between the wiring conductor 14 and a bonding wire or similar connecting member 3, and the bonding between the electrode 13 and the main face electrode 13a and the connection pads 51 for connecting that are formed on the module board 5. Additionally, a configuration is possible in which a copper plating layer having a thickness of about 10 to 80 µm is deposited on a base layer of, for example, a nickel plating layer and a gold plating layer over the wiring conductor 14 where the electronic component 2 is to be mounted in order to facilitate thermal dissipation of heat from the electronic component 2.

An electronic device can be fabricated by mounting the electronic component 2 on the top face of the wiring board 1. The electronic component 2 to be mounted on the wiring board 1 is any of a semiconductor element such as an integrated circuit (IC) chip, or a large-scale integration (LSI) chip, a light-emitting element, a piezoelectric element such as a crystal resonator, or a piezoelectric resonator, and various types of sensors and the like. For example, in a situation where the electronic component 2 is a wire bonded semiconductor element, the semiconductor element is mounted on the wiring board 1 by fixing the semiconductor element on the wiring conductor 14 using a bonding member such as a low melting point brazing material, a conductive resin, or the like, and then electrically connecting the electrode of the semiconductor element and the wiring conductor 14 via the bonding wire or similar connecting member 3. Additionally, for example, in a situation where the electronic component 2 is a flip-chip semiconductor element, the semiconductor element is mounted on the wiring board 1 by electrically and mechanically connecting an electrode of the semiconductor element and the wiring conductor 13 via the connecting member 3, which is one of a solder bump, a metal bump, a conductive resin (anisotropic conductive resin or similar), and the like. In addition, the electronic component 2 may be mounted on the wiring board 1 in plurality. Where necessary, a miniature electronic component such as a resistance element, or a capacitive element may also be mounted. Furthermore, where necessary, the electronic component 2 may be sealed by a lid made from one of resin, glass, ceramic, metal, or the like, using a encapsulant 4 made from one of resin, glass, or the like.

As illustrated in the example depicted in FIGS. 7A and 7B, the external electrode including the electrode 13 of the electronic device of the present embodiment is connected to the connection pads 51 of the module board 5 via the solder or similar bonding material 6. Thus, an electronic module is formed. The bonding material 6 is bonded to the electrode 13 within the cutout section 12, and to the main face electrode 13a at the bottom face of the insulating base 11. As such, in cases where stress from outside sources is applied, stress applied to the external electrode or the bonding material 6 can be dispersed. Additionally, the bonding material 6 is inclined so as to widen from an end portion on the inner side of the cutout section 12 of the electrode 13 to an end portion on the outer side of the connection pads 51. Due to this configuration, even if stress is generated in the electronic device due to external forces or the like when being handled, this stress will be dispersed due to the bonding material 6 that is inclined so as to widen. As a result, the electronic device will be firmly connected to the module board 5, and an electronic module with improved connection reliability can be obtained. In this case, when viewed perspectively planarly or, rather, when viewed perspectively from a direction perpendicular to the main face, the end portion on the outer side of the connection pads 51 is positioned farther outward than the end portion on the inner side of the cutout section 12 of the electrode 13. Additionally, the end portion on the inner side of the connection pads 51 is positioned at approximately the same location as the end portion on the inner side of the main face electrode 13a.

According to the wiring board 1 of the present embodiment, the wiring board 1 comprises the insulating base 11 comprising the main face and the side face; the cutout section 12 having a quadrilateral shape opened in the main face and the side face; the electrode 13 disposed on the inner face of the cutout section 12; and a wiring conductor 14 disposed on one of the inner part and the surface of the insulating base 11, and connected to the electrode 13. Additionally, the side wall 12a of the cutout section 12 comprises the protruding portion 12b that curves and protrudes outward relative to the side face at the center region in the direction along the side face. As such, even if stress is generated due to the difference in the coefficients of thermal expansion between the insulating base 11 and the electrode 13 when the electronic device is operated, this stress is dispersed in the inward direction of the cutout section 12, at the portion of the electrode 13 corresponding to the protruding portion 12b. As a result, separation of the electrode 13 from the cutout section 12 can be suppressed. Additionally, in cases where stress from outside sources is applied after the wiring board 1 has been connected to the module board 5 via the bonding material 6, the stress can be dispersed by the protruding portion 12b.

The wiring board 1 of the present embodiment can be advantageously used in a small, high-output electronic device, and provides excellent electrical connection with the wiring board 1. An example of an electronic component 2 for which the wiring board 1 of the present embodiment can be advantageously used is a small wiring board for mounting a light emitting element, on which a high-emission light emitting element is mounted.

According to the electronic device of the present embodiment, the wiring board 1 is configured as described above, and the electronic component 2 is mounted on the wiring board 1. As a result, electrical reliability and electrical performance are improved. In cases where the electronic component 2 is a light emitting element, a light emitting device capable of excellently emitting light over an extended period of time can be obtained.

According to the electronic module of the present embodiment, the electronic device, configured as described above, is connected to the connection pads 51 of the module board 5 via the bonding material 6. As a result, in cases where stress from outside sources is applied, stress that is applied to one of the external electrode and the bonding material 6 can be dispersed and, thus, a wiring board with excellent long-term electrical connection reliability to the module board 5 can be obtained.

Second Embodiment

Figure 8A:
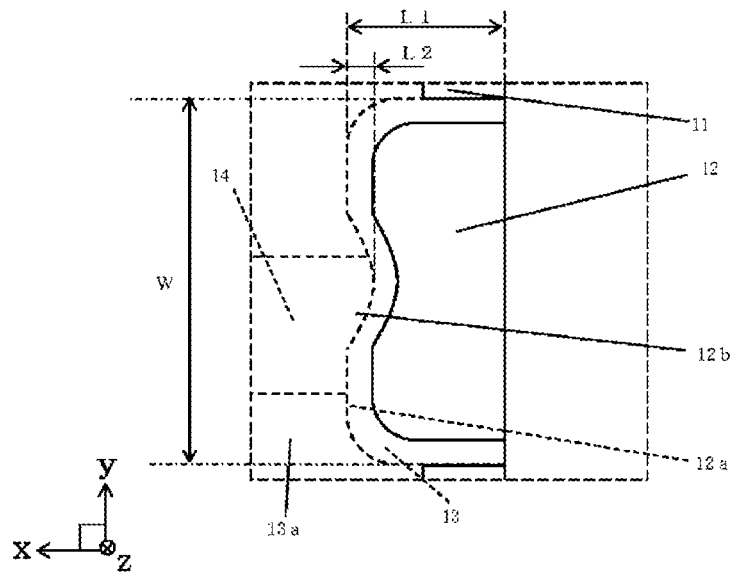
FIGS. 8A and 8B are main constituent enlarged bottom face views of an electronic device according to a second embodiment of the present invention.
Figure 8B:
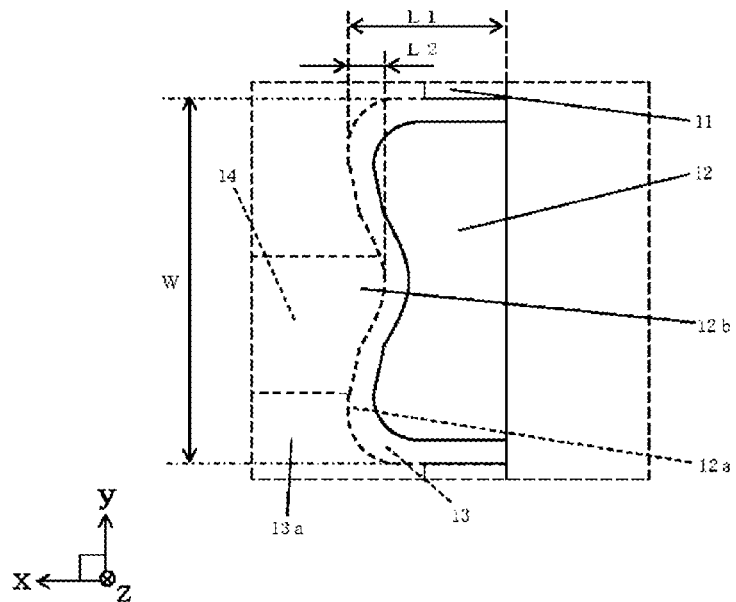

Next, an electronic device according to a second embodiment of the present invention is described, with reference to FIGS. 8A and 8B.

An electronic device according to the second embodiment of the present invention differs from the electronic device according to the first embodiment described above in that, with the electronic device according to the first embodiment of the present invention, an entirety of the center region in the direction along the side face of the insulating base 11, of the side wall 12a of the cutout section 12, is configured as a protruding curved face. In contrast, as illustrated in FIGS. 8A and 8B, with the electronic device according to the second embodiment of the present invention, in a plane perspective, the apex of the protruding portion 12*b* is located at the center in the direction (the Y direction in FIGS. 8A and 8B) along the side face of the insulating base 11 of the side wall 12*a* of the cutout section 12.

According to the wiring board of the second embodiment of the present invention, as with the wiring board of the first embodiment, stress is generated when the electronic device is operated due to the difference in the coefficients of thermal expansion between the insulating base 11 and the electrode 13. However, even in such cases, the stress is dispersed in the inward direction of the cutout section 12, at the portion of the electrode 13 corresponding to the protruding portion 12*b*. As a result, the electrode 13 can be suppressed from peeling from the cutout section 12. Additionally, in cases where the wiring board 1 is connected to the module board 5 via the bonding material 6, in cases where stress from outside sources is applied, the stress can be dispersed by the protruding portion 12*b*.

The wiring board 1 of the second embodiment can be fabricated using a manufacturing method that is the same as one of the first manufacturing method and the second manufacturing method described above.

The wiring board 1 of the second embodiment can be formed by providing a through-hole 212 intended as the cutout section 12 in advance in the ceramic green sheet by one of a punching process and a laser process; the through-hole 212 having a shape, in a plane perspective, including the protruding portion 12*b* located at the center in the direction along the side face of the insulating base 11 of the side wall 12*a* of the cutout section 12.

Additionally, as illustrated in FIG. 8B, in addition to the entirety of the direction along the side face of the insulating base 11 of the side wall 12*a* of the cutout section 12 being configured to protrude to the side face side of the insulating base 12, the apex may have a shape including the protruding portion 12*b* located at the center in the direction along the side face of the insulating base 11 of the side wall 12*a* of the cutout section 12.

The wiring board 1 illustrated in the example depicted in FIGS. 8A and 8B can be used when laminating the ceramic green sheet 111 and the ceramic green sheet 211 in, for example, cases where the pressure to be applied is small or the thickness of the wiring board 1 is thick.

Figure 9:
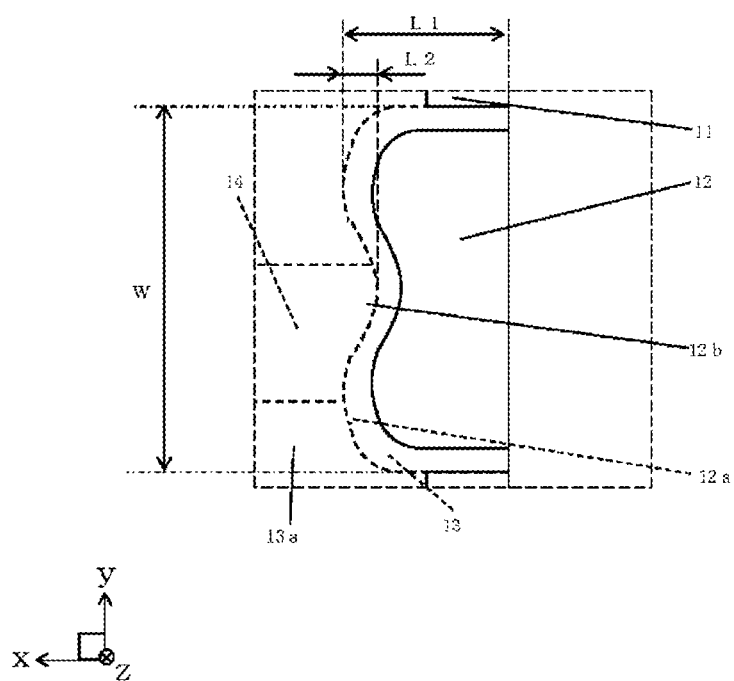
FIG. 9 is a main constituent enlarged bottom face view illustrating another example of the electronic device according to the second embodiment of the present invention.

Additionally, as illustrated in the example depicted in FIG. 9, in a plane perspective, portions of the cutout section 12 that contact corner portions in regions on both sides of the side wall 12*a* may be configured to curve toward the inner side of the side face of the insulating base 11. In this case, for example, the wiring board 1 can be formed by providing a through-hole 212 intended as the cutout section 12 in advance in the ceramic green sheet by one of a punching process a laser process; the through-hole 212 having a shape in which the portions that contact the corner portions in regions on both sides of the side wall 12*a* are curved toward the inner side of the side face of the insulating base 11.

As with the wiring board 1 illustrated in the example depicted in FIGS. 8A and 8B, the wiring board 1 illustrated in the example depicted in FIG. 9 can be used when laminating the ceramic green sheet 111 and the ceramic green sheet 211 in, for example, cases where the pressure to be applied is small or the thickness of the wiring board 1 is thick.

Additionally, with the wiring board 1 illustrated in the example depicted in FIG. 9, the length of the protruding portion 12*b*, that is, the protruding portion can be easily formed in a large manner. As such, in cases where the wiring board 1 is connected to the module board 5 via the bonding material 6, in cases where stress from outside sources is applied, the stress can be effectively dispersed by the protruding portion 12*b*.

Third Embodiment

An electronic device according to a third embodiment of the present invention is described next, with reference to FIGS. 10A, 10B, 11, 12A, 12B, 13A, and 13B.

The electronic device according to the third embodiment of the present invention differs from the electronic device of the first embodiment described above in that, as illustrated in the example depicted in FIGS. 10A, 10B, 11, 12A, 12B, 13A, and 13B, the cutout section 12 is open via a cutout of a width greater than the width of the cutout section 12, that is, cutouts with a plurality of sizes are stacked.

According to the wiring board 1 of the third embodiment, as with the wiring board of the first embodiment, stress is generated when the electronic device is operated due to the difference in the coefficients of thermal expansion between the insulating base 11 and the electrode 13. However, even in such cases, the stress is dispersed in the inward direction of the cutout section 12, at the portion of the electrode 13 corresponding to the protruding portion 12*b*. As a result, the electrode 13 can be suppressed from peeling from the cutout section 12. Additionally, in cases where stress from outside sources is applied after the wiring board 1 has been connected to the module board 5 via the bonding material 6, the stress can be dispersed by the protruding portion 12*b*.

Figure 10A:
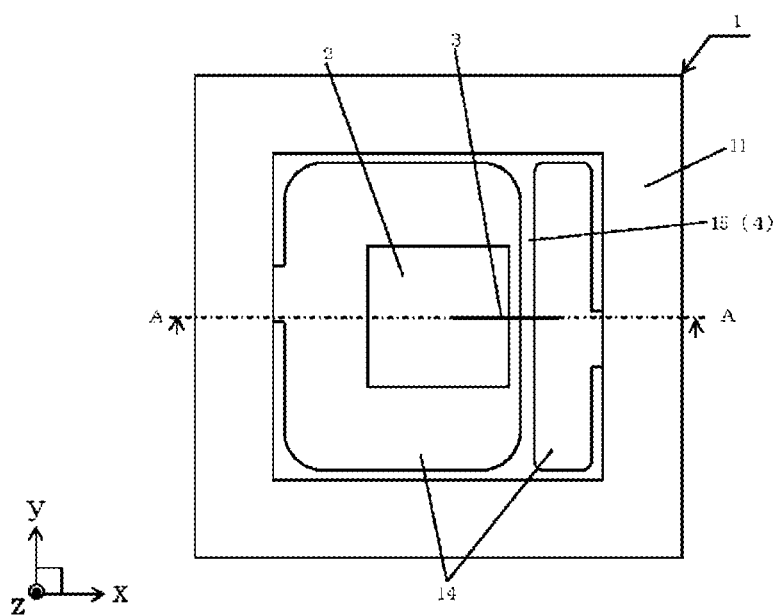
FIG. 10A is a top face view illustrating an electronic device according to a third embodiment of the present invention.
Figure 10B:
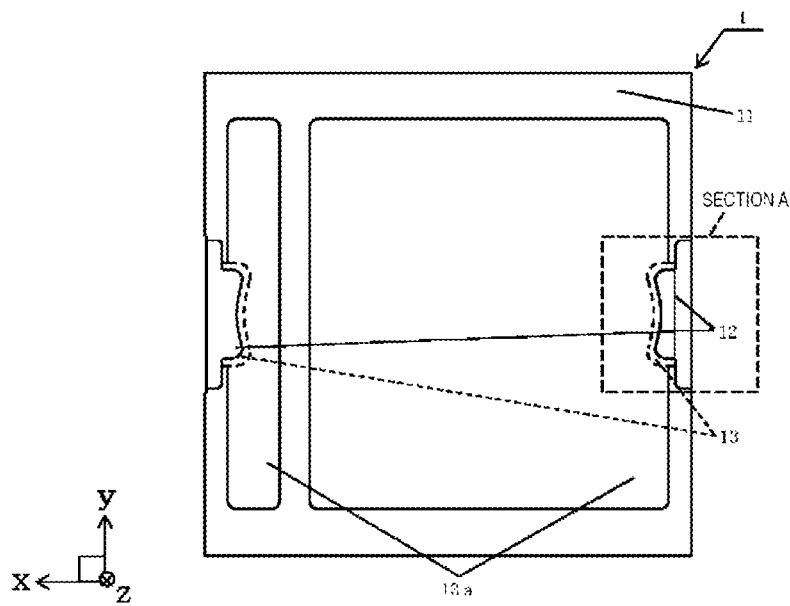
FIG. 10B is a bottom face view of FIG. 10A.
Figure 11:
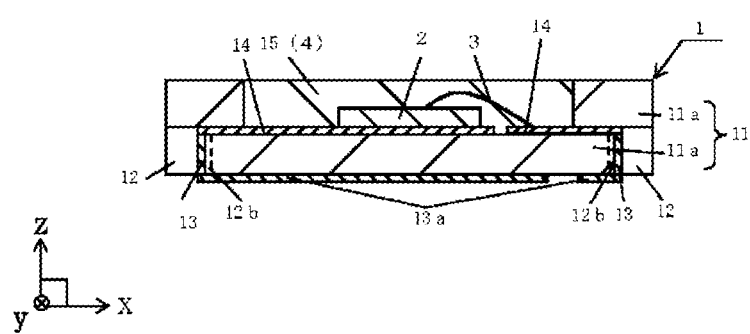
FIG. 11 is a cross-sectional view taken along line A-A of the electronic device depicted in FIG. 10A.

In the third embodiment, as illustrated in the example depicted in FIGS. 10A and 10B, when viewed planarly, the cutout section 12 is disposed on an inner side of a cutout that has a width greater than that of the cutout section 12, and the electrode 13 is disposed on the inner face of the cutout section 12. Due to the fact that, when viewed planarly, this cutout section 12 is disposed on the inner side of the cutout that has a greater width than the cutout section 12, there is no need to cut the electrode 13 when forming the cutout section 12. As a result, peeling of the electrode 13 from the insulating base 11 and shorting between the electrodes 13 that are disposed near to each other can be prevented, and an electronic device in which the wiring board 1 is used can be excellently mounted on the module board 5.

In the example illustrated in FIGS. 10A, 10B, 11, 12A, 12B, 13A, and 13B, the bulging outward relative to the side face of the insulating base 11 gradually increases only in the cutout section 12 as it gets further from each laterally neighboring region of the side wall 12*a* toward the apex in the center region. However, a configuration is possible in which the side wall of the entire larger cutout, which includes the cutout section 12, protrudes to the side face side of the insulating base 11.

Figure 12A:
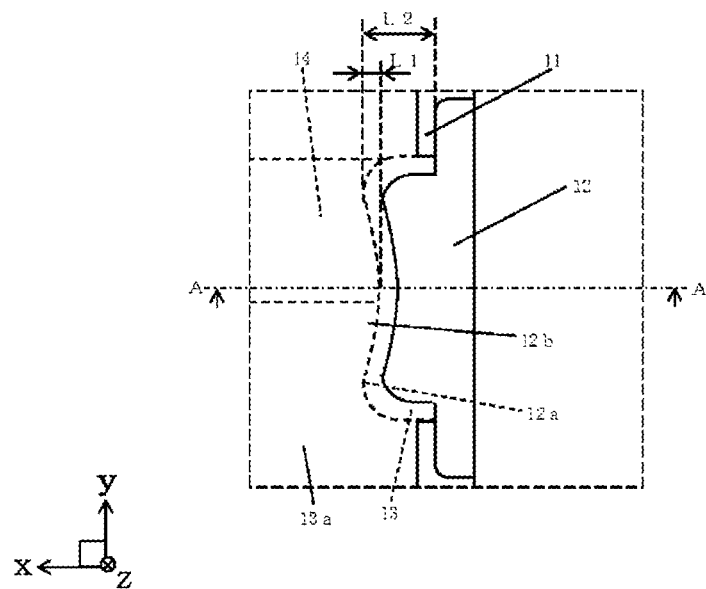
FIG. 12A is a main constituent enlarged bottom face view of section A of the electronic device depicted in FIG. 10B.
Figure 12B:
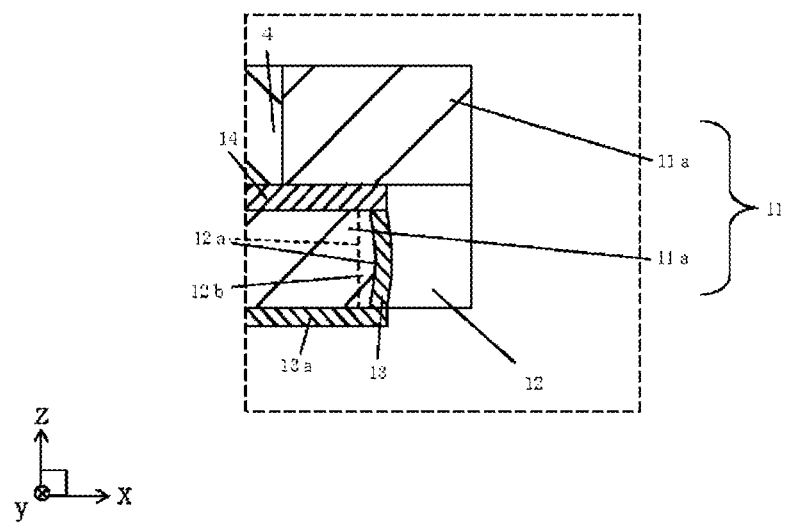
FIG. 12B is a cross-sectional view taken along line A-A in FIG. 12A.

As illustrated in the example depicted in FIG. 12B, it is preferable that the center region of the side wall 12*a* of the cutout section 12 in the direction along the side face of the insulating base 11 is protruding in a vertical cross-section view as well. This is because, in cases where stress from outside sources is applied after the wiring board 1 is connected to the module board 5 via the bonding material 6, stress applied to one of the external electrode and the bonding material 6 can also be dispersed in the thickness direction of the insulating base 11.

Additionally, as illustrated in the example depicted in FIG. 12A, it is preferable that the thickness of the electrode 13 at the inner corner portions of the cutout section 12 is thicker than the thickness of the electrode 13 at the inner face of the side wall 12a of the cutout section 12. This is because, in cases where stress from outside sources is applied after the wiring board 1 is connected to the module board 5 via the bonding material 6, cracking and the like of the electrode 13 at the inner corner portions of the cutout section 12 can be suppressed.

Here, the insulating base 11 includes a cavity 15 in the top face, as illustrated in the example depicted in FIGS. 10A, 10B, 11, 12A, 12B, 13A, and 13B. This cavity 15 may be formed by using one of laser processing and punching processing with a die on the ceramic green sheet, or similar. This forms a through-hole intended as the cavity 15 in a plurality of ceramic green sheets, and stacking the ceramic green sheets on a ceramic green sheet in which the through-hole is not formed produces the cavity 15. Also, in a situation where the insulating base 11 is thin, the through-hole for the cavity 15 is preferably formed after stacking the ceramic green sheets, by precise processing to form the cavity 15 with one of a laser process and a punching process using a die. Additionally, as illustrated in the example depicted in FIGS. 10A, 10B, 11, 12A, 12B, 13A, and 13B, the size of the cutout section 12 (the length from the side face of the insulating base 11 to the bottom of the side wall 12a of the cutout section 12) is about 25% to 75% of the width of a side wall portion of the cavity 15.

In a situation where the cavity 15 is a space for mounting a light-emitting element, an angle θ between an inner side wall of the cavity 15 and the bottom face of the cavity 15 is obtuse; and may, specifically, be an angle of from 110 degrees (110°) to 145 degrees (145°). Having the angle θ be within this range simplifies the stable and efficient formation of the through hole intended as the cavity 15 by punching processing of the inner side face, and facilitates miniaturization of a light-emitting device using the wiring board 1. Also, the light-emitting element is able to usefully emit light toward the exterior. This cavity 15, including the inner side face at the angle θ, is formed by punching the ceramic green sheets using a punching die set with a large clearance between punch diameters and dice hole diameters. That is, the clearance of the dice hole diameters with respect to the punch diameters is set larger in the punching die. As such, during the punching of the ceramic green sheets from one main face toward another main face, the green sheets experience shearing from an edge of a contact face with the punch toward an edge of a contact face with the dice holes, thus forming the through-hole with a diameter that grows wider from the one main face to the other main face. Here, the angle of the inner side face of the through hole formed in the ceramic green sheets is adjustable by setting the clearance of the punch diameters and the dice hole diameters in accordance with the thickness of the ceramic green sheets and the like. This punching method is highly productive, given that the method enables the angle θ between the inner side face of the cavity 15 and the bottom face of the cavity 15 to be set to a desired angle using the punching only.

In addition, the clearance between the punch diameters and the dice hole diameters may be small such that the through hole is formed by processing with the punching die with the angle θ being approximately 90 degrees (90°). Afterward, the through hole may be formed with a shape widening at the angle θ from the one main face to the other main face, as described above, by pressing a mold shaped as one of a truncated cone and a truncated pyramid to the inner side face of the through hole. In such a situation, the angle θ between the inner side face of the cavity 15 and the bottom face of the cavity 15 is more precisely adjustable.

In a situation where the wiring board 1 includes, for example, the insulating base 11 having a top face that includes the cavity 15 with a light-emitting element mounted thereon, the wiring board 1 may also be provided with a reflective layer for reflecting light emitted by the light-emitting element on the inner wall face of the cavity 15. The reflective layer includes, for example, a metal conductor layer disposed on the inside wall face of the cavity 15, and a plating layer deposited on the metal conductor layer. The metal conductor layer may be formed using similar materials and methods as the electrode 13, the main face electrode 13a, and the wiring conductor 14.

For example, in a situation where the light-emitting element is mounted on the wiring board 1, depositing a silver plating layer on an outermost surface of the metal conductor layer and depositing a gold plating layer on outermost surfaces of the electrode 13, the main face electrode 13a, and the wiring conductor 14 is preferable. This is because the gold plating layer has superb bonding performance with the electronic component 2, the connecting member 3, and the bonding material 6, in comparison to the silver plating layer. The silver plating layer, however, has high reflectivity with respect to light, in comparison to the gold plating layer. Also, an alloy plating layer of gold and silver may be deposited on the wiring conductor 14 at the location intended for mounting the light emitting element, and on the outermost surface of the metal conductor layer. For example, an alloy plating layer of gold and silver as a complete solid solution may be used.

The wiring board 1 of the third embodiment can be fabricated using a manufacturing method that is the same as one of the first manufacturing method and the second manufacturing method described above. Note that, as illustrated in the example depicted in FIGS. 10A, 10B, 11, 12A, 12B, 13A, and 13B, in cases where, in a planar view, the cutout section 12 is provided in the inner side of the cutout with the width that is larger than the that of the cutout section 12, and the electrode 13 is disposed on the inner face of the cutout section 12, the wiring board 1 can be formed by forming the through-hole 212 intended as the cutout section 12, print applying the conductive paste 113 for the electrode 13 by a screen printing method to the inner face of the through-hole 212 intended as the cutout section 12, and then partially cutting the through-hole 212 intended as the cutout section 12 at the through-hole intended as the larger cutout. After forming the through-hole of the shape where the through-hole 212 intended as the cutout section 12 and the through-hole intended as the larger cutout are stacked, the conductive paste 113 for the electrode 13 may be print applied by a screen printing method to only the inner face of the through-hole 212 intended as the cutout section 12. However, by using the manufacturing method described above, the electrode 13 can be formed with high precision on the inner face of the cutout section 12 and, also, the protruding portion 12b can be excellently formed.

As with the first embodiment, the wiring board 1 of the third embodiment can be advantageously used in a small, high-output electronic device, and provides excellent electrical connection with the wiring board 1. An example of an electronic component 2 for which the wiring board 1 of the present embodiment can by advantageously used is a small wiring board for mounting a light emitting element, on which a high-emission light emitting element is mounted.

Fourth Embodiment

Figure 14A:
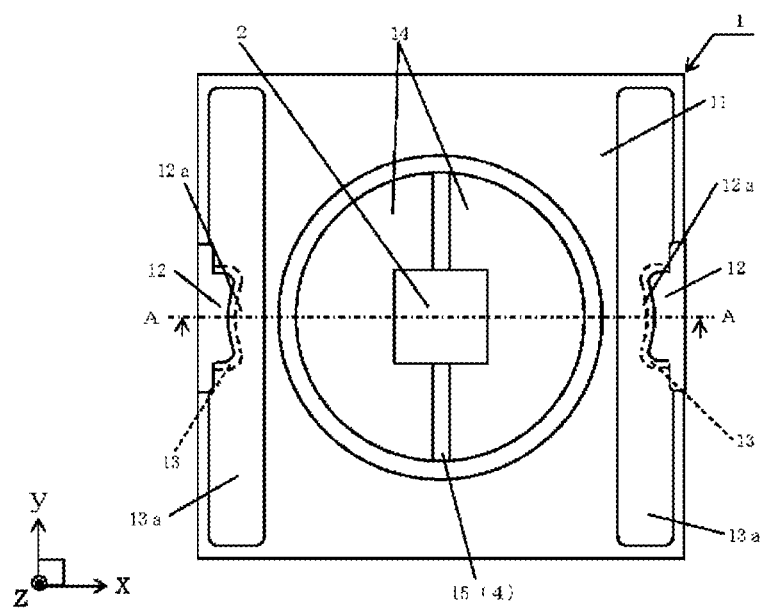
FIG. 14A is a top face view illustrating an electronic device according to a fourth embodiment of the present invention.
Figure 14B:
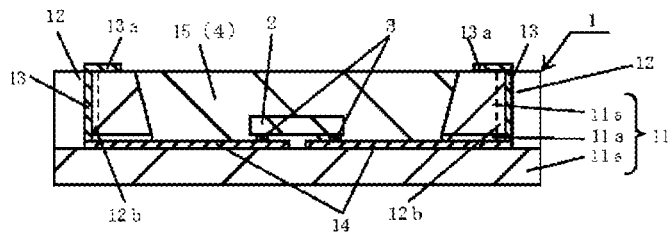
FIG. 14B is a cross-sectional view taken along line A-A in FIG. 14A.
Figure 14B:
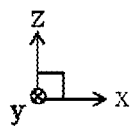

An electronic device according to a fourth embodiment of the present invention is described next, with reference to FIGS. 14A and 14B.

The electronic device according to the fourth embodiment of the present invention differs from the electronic device of the first embodiment described above in that, as illustrated in the example depicted in FIGS. 14A and 14B, the cutout section 12 is open in the same one main face (hereinafter referred to also as "top face") as a mounting face of the electronic component 2 and the side face.

According to the wiring board of the fourth embodiment of the present invention, as with the wiring board of the first embodiment, stress is generated when the electronic device is operated due to the difference in the coefficients of thermal expansion between the insulating base 11 and the electrode 13. However, even in such cases, the stress is dispersed in the inward direction of the cutout section 12, at the portion of the electrode 13 corresponding to the protruding portion 12b. As a result, the electrode 13 can be suppressed from peeling from the cutout section 12. Additionally, in cases where stress from outside sources is applied after the wiring board 1 has been connected to the module board 5 via the bonding material 6, the stress can be dispersed by the protruding portion 12b.

Additionally, the wiring board 1 can be joined to the module board 5 by the solder or similar bonding material 6, at the top face side of the wiring board 1. As such, heat dispersion performance of the wiring board 1 may be improved by joining a member having a higher rate of thermal conductivity than the insulating base 11 over the entirety of the bottom face side of the wiring board 1. In cases where the insulating base 11 is formed from an aluminum oxide-based sintered body, examples of the material having a higher rate of thermal conductivity than the insulating base 11 include metal materials such as copper (Cu), copper-tungsten (Cu—W), aluminum (Al), and the like, insulating bodies formed from aluminum nitride-based sintered bodies, and the like. In such a wiring board 1, the portions contacting the corner portions of regions on both sides of the cutout section 12 are curved toward the inner side of the side face of the insulating base 11. As such, peeling of the electrode 13 from the cutout section 12 can be suppressed, and the amount of heat transmitted to the cutout section 12 side from the electronic component 2 mounted on the wiring board 1 can be suppressed. Therefore, the stress applied to one of the electrode 13 and the bonding material 6 can be more effectively reduced.

As with the first embodiment, the wiring board 1 of the fourth embodiment can be advantageously used in a small, high-output electronic device, and provides excellent electrical connection with the wiring board 1. An example of an electronic component 2 for which the wiring board 1 of the present embodiment can by advantageously used is a small wiring board for mounting a light emitting element, on which a high-emission light emitting element is mounted.

The wiring board 1 of the fourth embodiment can be fabricated using a manufacturing method that is the same as one of the first manufacturing method and the second manufacturing method described above.

Fifth Embodiment

An electronic device according to a fifth embodiment of the present invention is described next, with reference to FIGS. 15A, 15B, and 16.

Figure 15A:
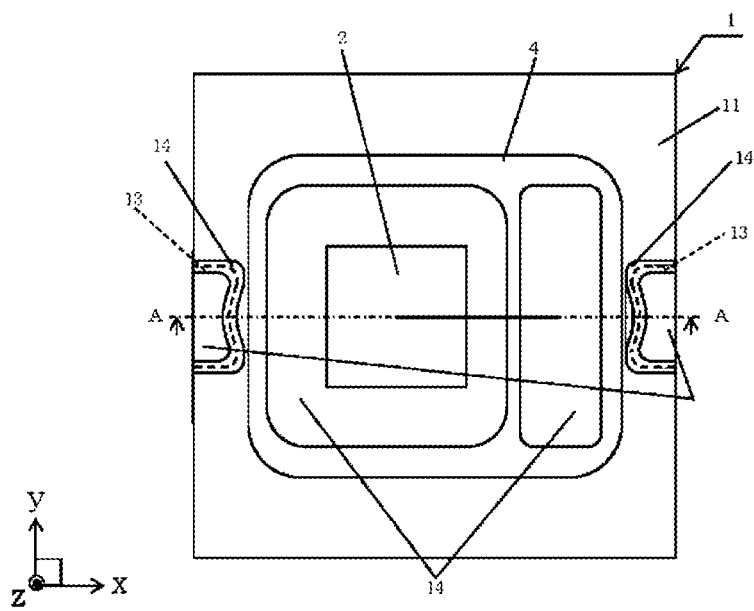
FIG. 15A is a top face view illustrating an electronic device according to a fifth embodiment of the present invention.
Figure 15B:
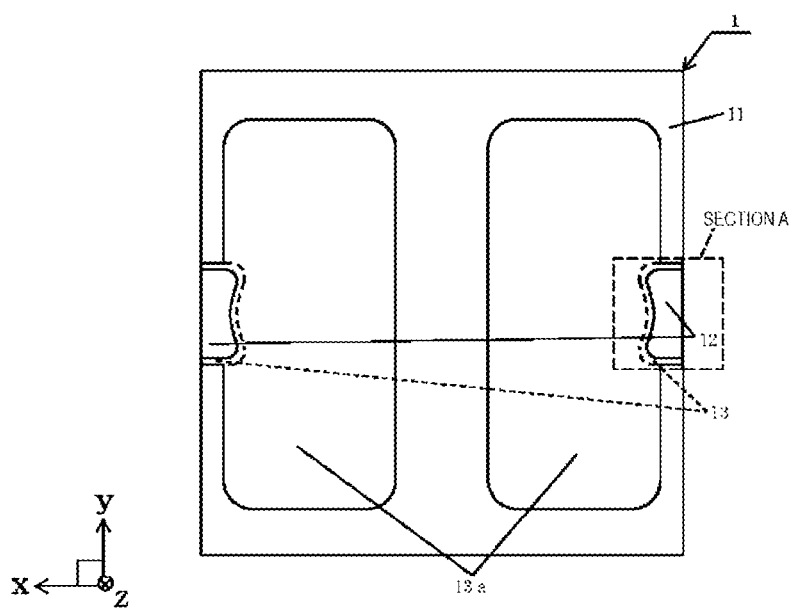
FIG. 15B is a bottom face view of FIG. 15A.
Figure 16:
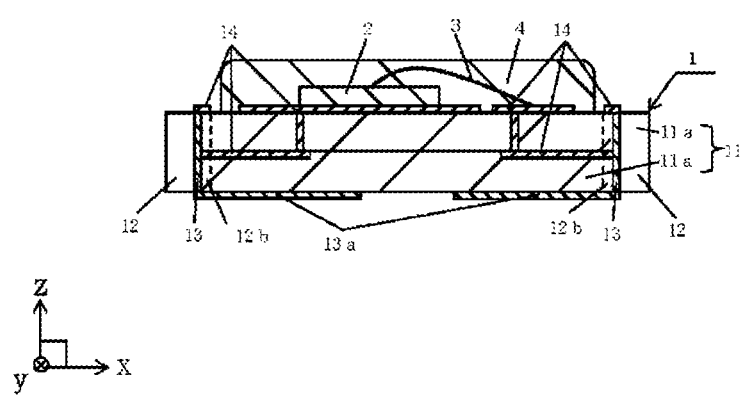
FIG. 16 is a cross-sectional view taken along line A-A of the electronic device depicted in FIG. 15A.

The electronic device according to the fifth embodiment of the present invention differs from the electronic device of the first embodiment described above in that, as illustrated in the example depicted in FIGS. 15A, 15B, and 16, the cutout section 12 is open in a main face, another main face opposing the main face, and a side face of the insulating base 11.

According to the wiring board of the fifth embodiment of the present invention, as with the wiring board of the first embodiment, stress is generated when the electronic device is operated due to the difference in the coefficients of thermal expansion between the insulating base 11 and the electrode 13. However, even in such cases, the stress is dispersed in the inward direction of the cutout section 12, at the portion of the electrode 13 corresponding to the protruding portion 12b. As a result, the electrode 13 can be suppressed from peeling from the cutout section 12. Additionally, in cases where stress from outside sources is applied after the wiring board 1 has been connected to the module board 5 via the bonding material 6, the stress can be dispersed by the protruding portion 12b.

The wiring board 1 of the fifth embodiment can be fabricated using a manufacturing method that is the same as one of the first manufacturing method and the second manufacturing method described above.

Additionally, as illustrated in the example depicted in FIGS. 15A, 15B, and 16, the size of the cutout section 12 opened in both main faces of the insulating base 11 is the same. However, for example, the size of the cutout section 12 at the top face side of the insulating base 11 and the size of the cutout section 12 at the bottom face side of the insulating base 11 may differ. With such a wiring board 1, sizes of the through-holes 212 intended as the cutout section 12 that are formed in the ceramic green sheet 111 and the ceramic green sheet 211 are varied. For example, by configuring the cutout section 12 on the bottom face of the insulating base 11 to be larger than the cutout section 12 on the top face of the insulating base 11, the mounting region of the electronic component 2 on the top face side of the insulating base 11 can be made larger and the electrical connection reliability with the module board 5 can be improved.

The present invention is not limited to the above-described embodiments. Various modified examples are also applicable. In the above-described examples, the cutout section 12, and the electrode 13 are provided individually on each of two opposing side faces of the insulating base 11. However, configurations are possible in which the cutout section 12 and the electrode 13 are provided in all four side faces of the insulating base 11, and in which the cutout section 12 and the electrode 13 are provided in plurality on each edge of the wiring board 1. Additionally, in the examples illustrated in FIGS. 1 to 16, the insulating base 11 is formed from two or three layers of the insulating layer 11a. However, configurations are possible in which the insulating base 11 is formed from four or more layers of the insulating layer 11a.

Figure 13A:
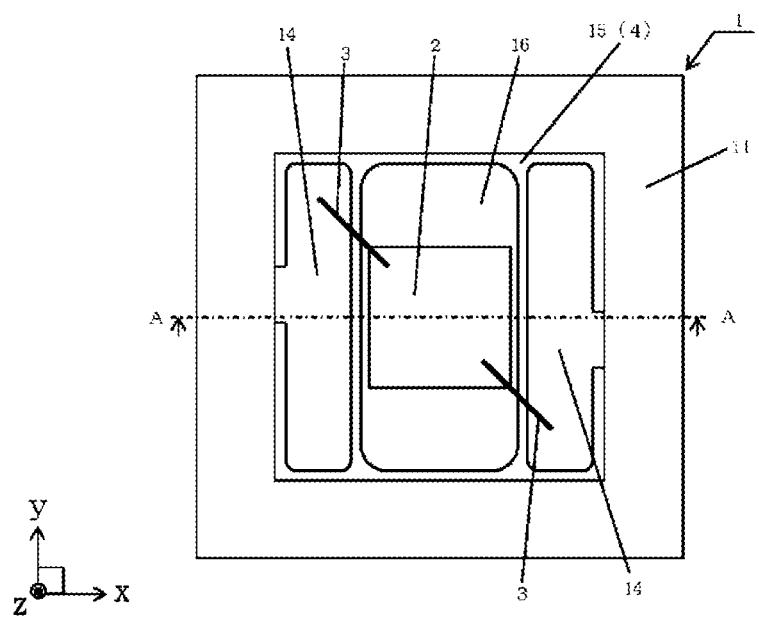
FIG. 13A is a top face view illustrating another example of the electronic device according to the third embodiment of the present invention.
Figure 13B:
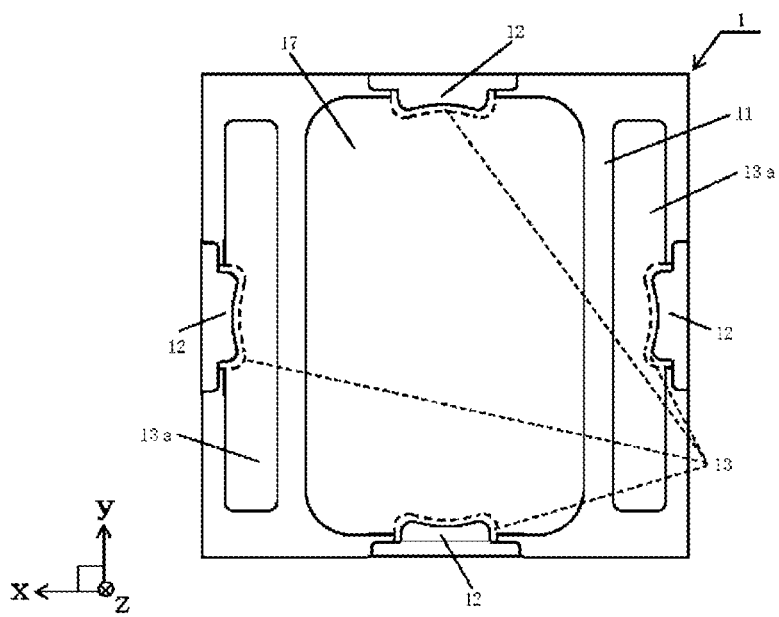
FIG. 13B is a bottom face view of FIG. 13A.

In addition, as illustrated in the examples depicted in FIGS. 13A and 13B, the wiring board 1 may also include conductors other than wiring, such as an electronic component mounting layer 16, a central terminal layer 17, and the like. For example, these conductors may be manufactured using similar materials and methods as the electrode 13 and the wiring conductor 14 described above, and a plating layer may be deposited on exposed surfaces thereof similarly to the electrode 13 and the wiring conductor 14. The electronic component mounting layer 16 is, for example, used for mounting the electronic component 2. The central terminal layer 17 is, for example, used for bonding to the module board 5, similarly to the electrode 13 and the main face electrode 13a. Additionally, as illustrated in the example depicted in FIGS. 13A and 13B, the central terminal layer 17 may also be connected to the electrode 13 disposed on the inner face of the cutout section 12.

Additionally, the wiring boards 1 according to the first to the fifth embodiments may each be a flat plate shaped wiring board 1, or may be a wiring board 1 including the cavity 15. Additionally, with the wiring boards 1 according to the fourth and fifth embodiments, as with the wiring board 1 according to the third embodiment, the cutout section 12 may be configured with a shape in which cutout sections 12 of a plurality of sizes are stacked, and the electronic component mounting layer 16 and the central terminal layer 17 may be included.

Also, in the above-described examples, only one of the electronic component 2 is mounted on the wiring board 1. However, a configuration is possible in which the electronic component 2 is mounted in plurality on the wiring board 1.

Additionally, in the above-described examples, the main face electrode 13 and the wiring conductor 14 are connected via the electrode 13. However, a configuration is possible in which the wiring conductor 14 is connected directly to the main face electrode 13*a* by a through conductor that passes through the insulating layer 11*a*.

Additionally, the wiring board 1 may also be manufactured by taking multiple pieces of wiring board.

REFERENCE SIGNS LIST

1 Wiring board
11 Insulating base
11*a* Insulating layer
12 Cutout section
12*a* Side wall
12*b* Protruding portion
13 Electrode
13*a* Main face electrode
14 Wiring conductor
15 Cavity
16 Electronic component mounting layer
17 Central terminal layer
2 Electronic component
3 Connecting member
4 Encapsulant
5 Module board
51 Connection pad
6 Bonding material

The invention claimed is:

1. A wiring board comprising:
   an insulating base comprising a main face and a side face;
   a cutout section having a quadrilateral shape opened in the main face and the side face;
   an electrode disposed on an inner face of the cutout section; and
   a wiring conductor disposed on one of an inner part and a surface of the insulating base, and connected to the electrode,
   wherein
   a side wall of the cutout section comprises a protruding portion that curves and protrudes outward relative to the side face at a center region in a direction along the side face.

2. The wiring board according to claim 1, wherein
   bulging of the protruding portion outward relative to the side face gradually increases as it gets further from each laterally neighboring region of the side wall of the cutout section toward an apex in a center region.

3. The wiring board according to claim 1, wherein
   the cutout section is line-symmetric with the apex of the protruding portion positioned on a center line when viewed from the bottom.

4. The wiring board according to claim 1, wherein
   a portion of the cutout section located around corner portion in each end region of the side wall curves inward of the side face.

5. The wiring board according to claim 1, wherein
   an apex of the protruding portion is located at a center in a direction along the side face of the side wall of the cutout section.

6. The wiring board according to claim 1, wherein
   the cutout section is disposed on an inner side of a cutout with a greater width.

7. The wiring board according to claim 1, wherein
   the side wall of the protruding portion has a convex shape in a center region in a direction along the side face of the side wall in a vertical cross-section.

8. The wiring board according to claim 1, wherein
   the cutout section is opened in the other main face opposite the main face.

9. An electronic device comprising:
   the wiring board according to claim 1; and
   an electronic component mounted on the wiring board.

10. An electronic module comprising:
    the electronic device according to claim 9; and
    a module board;
    wherein
    the electrode of the electronic device is connected to a connection pad of the module board by a bonding material.

* * * * *